(12) United States Patent
Thirupapuliyur et al.

(10) Patent No.: US 8,105,908 B2
(45) Date of Patent: Jan. 31, 2012

(54) METHODS FOR FORMING A TRANSISTOR AND MODULATING CHANNEL STRESS

(75) Inventors: Sunderraj Thirupapuliyur, Sunnyvale, CA (US); Faran Nouri, Los Altos, CA (US); Lori Washington, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 653 days.

(21) Appl. No.: 11/165,282

(22) Filed: Jun. 23, 2005

(65) Prior Publication Data

US 2006/0289900 A1    Dec. 28, 2006

(51) Int. Cl.
*H01L 21/336* (2006.01)
(52) U.S. Cl. ............ 438/285; 438/590; 257/194; 716/4; 716/5; 703/2; 703/14; 703/15; 703/16
(58) Field of Classification Search .................. 257/194; 438/285, 590; 716/5, 4; 703/2, 14, 15, 16
See application file for complete search history.

(56) References Cited

U.S. PATENT DOCUMENTS

| | | | | |
|---|---|---|---|---|
| 6,124,174 A * | 9/2000 | Gardner et al. | ............... | 438/303 |
| 6,373,108 B1 * | 4/2002 | Yamakawa et al. | ............ | 257/382 |
| 6,867,433 B2 * | 3/2005 | Yeo et al. | ........................ | 257/67 |
| 6,870,179 B2 | 3/2005 | Shaheed et al. | | |
| 6,881,635 B1 | 4/2005 | Chidambarrao et al. | | |
| 2004/0029323 A1 * | 2/2004 | Shimizu et al. | ............... | 438/142 |
| 2004/0113217 A1 * | 6/2004 | Chidambarrao et al. | ...... | 257/415 |
| 2004/0153986 A1 * | 8/2004 | Sahara et al. | .................... | 716/10 |
| 2004/0262683 A1 * | 12/2004 | Bohr et al. | ..................... | 257/338 |
| 2005/0093078 A1 | 5/2005 | Chan et al. | | |
| 2005/0224867 A1 * | 10/2005 | Huang et al. | .................. | 257/327 |
| 2005/0285202 A1 * | 12/2005 | Huang et al. | .................. | 257/368 |
| 2006/0138398 A1 | 6/2006 | Shimamune et al. | | |
| 2006/0284255 A1 * | 12/2006 | Shin et al. | ..................... | 257/351 |

FOREIGN PATENT DOCUMENTS

WO    WO-2004/095552    11/2004

OTHER PUBLICATIONS

Nouri et al, A Systematic Study of Trade-offs in Engineering a Locally Strained pMOSFET, IEDM 04, 2004, pp. 1055-1058.*
ISE News, Aug. 2004, www.ise.ch, www.ise.com.*
TCAD News, IEDM 2004, www.synopsys.com.*
Rim et al, Fabrication and Analysis of Deep Submicron Strained-Si N-MOSFET's, IEEE Transactions on Electron Devices, vol. 47, No. 7, Jul. 2000.*
Rogers et al, "The use of semantic networks to support concurrent engineering in semiconductor product development," Journal of Intelligent Manufacturing (1995), 6, pp. 311-319.*
Hallas et al, "An Investigation of Operating Methods for 0.25 Micron Semiconductor Manufacturing," Proceedings of the 1996 Winter Simulation Conference, San Diego.*

(Continued)

*Primary Examiner* — Kenneth Parker
*Assistant Examiner* — Anthony Ho
(74) *Attorney, Agent, or Firm* — Diehl Servilla LLC

(57) ABSTRACT

Methods are provided for manufacturing transistors and altering the stress in the channel region of a single transistor. One or more parameters that are effect stress in the channel region are altered for a single transistor to increase or decrease the channel stress in PMOS and NMOS transistors.

6 Claims, 10 Drawing Sheets

OTHER PUBLICATIONS

Scovell et al, "Modelling of VLSI semiconductor manufacturing process," Rep. Prog. Phys. 52 (1989), pp. 349-388.*

Giles et al "Understanding Stress Enhanced Performance in Intel 90 nm CMOS Technology" 2004 Symposium on VLSI Technology Digest of Technical Papers, pp. 118-119.*

"SiGen Wafer-Scale Uniaxial Strain Technology for Next-Generation-Strain (NGS) Substrates", http://www.sigen.com/ngsVer2.htm, (Oct. 10, 2004).

Cai, J., et al., "Performance Comparison and Channel Length Scaling of Strained Si FETs on SiGe-on-Insulator (SGOI)", *IEDM Tech. Dig.*, (2004),165-168.

Welsh, Valerie, "Work Function Engineering with Molybdenum and Molybdenum-Nitride Gate PMOS", *22nd Annual Microelectronic Engineering Conference*, (May 2004).

"Press Release—SiGen Announces Breakthrough in Strained Silicon Technology", http://www.sigen.com/pr/press_2004-8-10.htm.

Arena, C., et al., "Expitaxy Challenges for Strained Silicon in SOI Integration", *Semiconductor International*, (Mar. 1, 2005),1-6 http://www.reed-electronics.com.

Boeuf, F., et al., "A Conventional 45nm CMOS Node Low-Cost Platform for General Purpose and Low Power Applications", *IEDM*, (04),425-428.

Gallon, C., et al., "Mechanical and Electrical Analysis of Strained Liner Effect in 35 nm Fully Depleted Silicon-on-Insulator Devices with Ultra Thin Silicon Channels", *Japanese Journal of Applied Physics* vol. 45 No. 4B, (2006),3058-3063.

Isaacson, David M., et al., "Strained Silicon on Silicon by Wafer Bonding and Layer Transfer from Relaxed SiGe Buffer", *MIT*, (Nov. 19, 2004).

Komoda, T., et al., "Mobility Improvement for 45nm Node by Combination of Optimized Stress Control and Channel Orientation Design", *IEDM 04*, 217-220.

Moroz, Victor, et al., "Analyzing Strained-Silicon Options for Stress-Engineering Transistors", *Solid State Technology 47:7*, (Jul. 2004),49-50, 52.

Nouri, F., et al., "A Systematic Study of Trade-offs in Engineering a Locally Strained pMOSFET", *IEDM*, (04), 1055-1058.

Pidin, S., et al., "A Novel Strain Enchanced CMOS Architecture Using Selectively Deposited High Tensile and High Compressive Silicon Nitride Films", *IEDM 04*, 213-216.

Sanuki, T., et al., "New Stress Inducing Technique of Epitaxial Si on Recessed S/D Fabricated in Substrate Strained-Si of <100> Channel on Rotated Wafers", *IEEE*, (2005), p. 4.

Thompson, Scott E., et al., "A Logic Nanotechnology Featuring Strained-Silicon", *IEEE Electron Device Letters*, vol. 25, No. 4, (Apr. 2004),191-193.

Washington, Lori, et al., "Impact of Recessed S/D Sige Integration Parameters on Device Performance", *Electrochemical Society Proceedings* vol. PV 2005-05, 515-522.

Washington, Lori, et al., "pMOSFET With 200% Mobility Enhancement Induced by Multiple Stressors", *IEEE* vol. 27 No. 6, (Jun. 2006),511-513.

* cited by examiner

METHODS FOR FORMING A TRANSISTOR AND MODULATING CHANNEL STRESS

BACKGROUND

Embodiments of the invention generally relate to semiconductor manufacturing processes and devices.

As smaller transistors are manufactured, ultra shallow source/drain junctions for sub-100 nm CMOS (complementary metal-oxide semiconductor) devices, such as silicon-containing MOSFET (metal oxide semiconductor field effect transistor) devices, are becoming more challenging to produce. Such MOS(FET) transistors may include p-channel MOS (PMOS) transistors, and n-channel MOS (NMOS) transistors, depending on the dopant conductivity types, whereas the PMOS has a p-type channel, i.e., holes are responsible for conduction in the channel and the NMOS has an n-type channel, i.e., the electrons are responsible for conduction in the channel.

Silicon based materials may be used in device creation for MOSFET devices. For example, in a PMOS application, the film in a recessed area of the transistor may be manufactured from silicon-germanium, and for a NMOS application, the film in the recessed area may be SiC. Silicon-germanium is advantageously used to implant more boron than silicon alone to reduce junction resistivity, which improves device performance, and the silicon-germanium interface with the silicide layer at the substrate surface has a lower Schottky barrier than the silicon interface with silicon-germanium, which also decreases series resistance in the device and improves performance. Alternatively, as is known in the art, the device could be made from essentially pure silicon that contains dopants necessary to make the device a P-type or N-type device and may contain implanted Ge.

The recessed areas comprise source/drain extension or source/drain features, which are manufactured by etching silicon to make a recessed source/drain feature and subsequently filling the etched surface with a selectively grown silicon-germanium epilayer. The mismatch of lattices between silicon and the silicon-germanium material generates compressive strain which is transferred in the lateral dimension of the junction to create longitudinal compressive strain in the PMOS channel and to increase mobility of the holes and improve device performance. In NMOS applications, increased longitudinal and transverse tensile strain increases the electron mobility in the device. Thus, in either case, the straining of the silicon material is a technique to increase the charge carriers' mobility, which enhances device performance.

Known methods of obtaining strain in transistor devices include two general approaches. A first approach is developing strain at the substrate level before any transistor device is fabricated. This first approach will be referred to herein as the "global" approach, and includes the provision of biaxial strain along two axes. A second approach to obtaining strain will be referred to herein as the "local" approach, and includes adjusting the properties of local films or layers on the transistor device during transistor fabrication to impart uniaxial strain, or stress predominantly along one axis, although this approach could also cause strain along a second axis, namely, the vertical axis. Local strain includes imparting stress to selected transistor regions.

There are various known ways of changing local strain in transistors, and these ways will be referred to herein as "parameters that effect strain" or "stressors." Sources of local strain include but are not limited to the embedded silicon-germanium in the source/drain regions of a transistor, the etch stop nitride layers of the transistor with built-in intrinsic stress, the strain from the shallow trench isolation (STI), the strain in the polysilicon/metal gate electrode or the sidewall spacer dielectric with in-built intrinsic stress. By modulating or changing a parameter of one of these sources of strain, the strain in the transistor device can be modulated. For example, the dimensions of the spacer, the etch stop, elevation of the source/drain region, the composition of the source/drain region or composition of the etch stop are examples of parameters that can be changed to modulate the strain in a transistor. Current methods of modulating the strain in transistor devices involve changing a single source of parameter for each transistor. For continued device scaling, there is a need to provide increased strain in the channel for sustained device improvements from one technology node to another. Therefore, there is a need to provide methods of increasing the strain in a single transistor device.

SUMMARY

Embodiments of the invention relate to methods of forming transistor devices and modulating the strain in the channel region of a single transistor. According to one or more embodiments, strain in a channel region of a single transistor is modulated by changing or modulating a plurality of parameters that effect uniaxial local strain on selected regions of the transistor. In certain embodiments, the plurality of parameters that effect local strain includes two sources of stress, and in other embodiments, the plurality of sources of stress includes three sources of stress. Parameters that modulate the stress or strain include, but are not limited to, source/drain elevation, source/drain silicon and germanium concentration, source/drain dimensions, source/drain facet, source/drain dopant concentration, etch stop composition, etch stop dimensions, number of etch stop layers, etch stop spacer dimensions, spacer thickness, gate electrode dimensions and combinations thereof. In some embodiments, three or more of theses sources of stress can be used together and one or more parameters can be modulated to further increase or decrease the strain in the channel region of a single transistor. Other aspects of the invention include transistor devices and integrated circuits formed by the methods described herein.

BRIEF DESCRIPTION OF THE DRAWINGS

Advantages of the various aspects and embodiments of the invention will be apparent from the following detailed description and drawings. It is to be understood that both the foregoing general description and the following detailed description are exemplary and are intended to provide further explanation of the invention as claimed. The appended drawings illustrate only typical embodiments of this invention and are therefore not to be considered limiting of its scope, for the invention may admit to other equally effective embodiments.

DETAILED DESCRIPTION

According to one or more embodiments of the present invention, processes for forming semiconductor devices including the epitaxial deposition of silicon containing compounds are provided. Herein, silicon containing compounds include deposited layers or films of silicon (Si), silicon-germanium (SiGe), silicon carbide (SiC), silicon germanium carbide (SiGeC), doped variants thereof, and combinations thereof.

The term "channel region" refers to the area of a transistor located between source/drain regions. The term "tensile strain" acting on the channel region of a field effect transistor means a stress to make a lattice constant of silicon greater than that under equilibrium when the channel region is silicon. The term "compressive strain" acting on the channel region of a field effect transistor means a stress to make a lattice constant of silicon smaller than that under equilibrium when the channel formation region is silicon.

Figure 1:
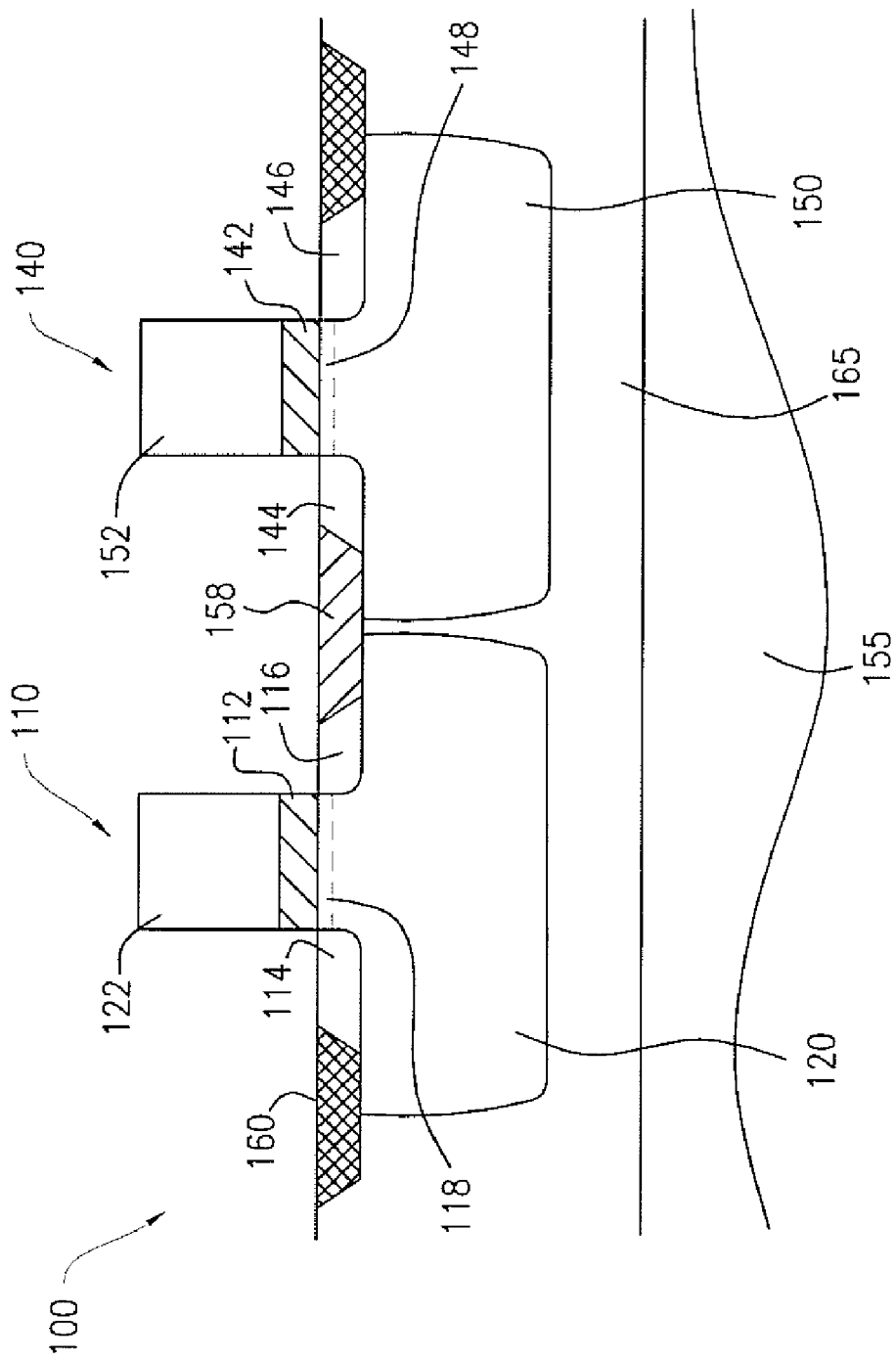
FIG. 1 is a cross-sectional view of a field effect transistor pair.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Gate dielectric layer 112 electrically insulates gate electrode 122 from channel region 118. The gate dielectric layer 112 and the gate electrode 122 together may be referred to herein as a gate stack. The gate dielectric region 112 may be a silicon oxide, a silicon nitride, a silicon oxynitride or a high K dielectric such as $HfO_2$. As used herein, high K dielectric refers to a material that has a dielectric constant greater than about 4. The gate dielectric layers may be deposited to a thickness between about 5 Angstroms and about 100 Angstroms.

According to one or more embodiments, the gate electrode 122 is made from silicon or polysilicon, which may be deposited by chemical vapor deposition or any other appropriate technique known in the art of making silicon layers. As is known in the art, the gate electrode 122 may be doped to form N-type materials. Processes for forming the NMOS gate electrode 122 and dielectric layer are known in the art and are not discussed further herein. In other embodiments which are not shown, the gate electrode 122 may include a multilayer metal gate comprising first metal region and a second metal region, as is known in the art. For both types of gates (silicon or metal gates), a silicide layer may be formed over the gate electrode 122 to decrease the resistance of the gate.

When an appropriate voltage is applied between p-type silicon wafer 155 and gate electrode 122, electrons from p-well 120 move into channel region 118 directly below dielectric layer 112 thereby creating an n-type channel 118. A voltage applied between source 114 and drain 116 causes current to flow between source 114 and drain 116.

In the NMOS device, a suitable conductivity may be in the range between about $1 \times 10^{17}$ atoms/$cm^3$ and about $1 \times 10^{19}$ atoms/$cm^3$. The n-type regions may be formed by one or more implant processes using phosphorous atoms, and optionally, a final implant of arsenic atoms into the silicon substrate. The n-type regions may be formed by other means including providing an initially doped substrate, or depositing an in situ doped semiconductor material with a desired conductivity.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a N-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. The dielectric can be an oxynitride or a high K dielectric such as $HfO_2$. The gate dielectric layer 142, and gate electrode 152 together may be referred to herein as a gate stack.

According to one or more embodiments, the PMOS gate electrode 152 is made from silicon or polysilicon, which may be deposited by chemical vapor deposition or any other appropriate technique known in the art of making silicon layers. As is known in the art, the gate electrode 152 may be doped to form P-type materials. Processes for forming the PMOS gate electrode 122 and dielectric layer are known in the art and are not discussed further herein. In other embodiments which are not shown, the gate electrode 152 may include a metal gate comprising a first metal region and a second metal region, as is known in the art. As with the NMOS transistor described above, a silicide layer may be formed over the gate electrode 152 to decrease the resistance of the gate.

The processes of the invention can be carried out in equipment known in the art of atomic layer epitaxy (ALE), chemical vapor deposition (CVD) and atomic layer deposition (ALD). The apparatus brings the sources into contact with a heated substrate on which the silicon compound films are grown. The processes can operate at a range of pressures from about 1 mTorr to about 2,300 Torr, preferably between about 0.1 Torr and about 200 Torr. Hardware that can be used to deposit silicon-containing films includes the Epi Centura® system, and the Poly Gen® system available from Applied Materials, Inc., located in Santa Clara, Calif. A suitable ALD apparatus is disclosed in U.S. Patent Application Publication 20030079686, assigned to Applied Material, Inc., and entitled "Gas Delivery Apparatus and Methods for ALD", which publication is incorporated herein by reference in entirety for the purpose of describing the apparatus. Other suitable apparatus include batch, high-temperature furnaces, as known in the art. It will be appreciated that the structures of the transistors 110 and 140 shown in FIG. 1 and described immediately above are exemplary only, and various variants in materials, layers, etc. are within the scope of the present invention.

Figure 2:
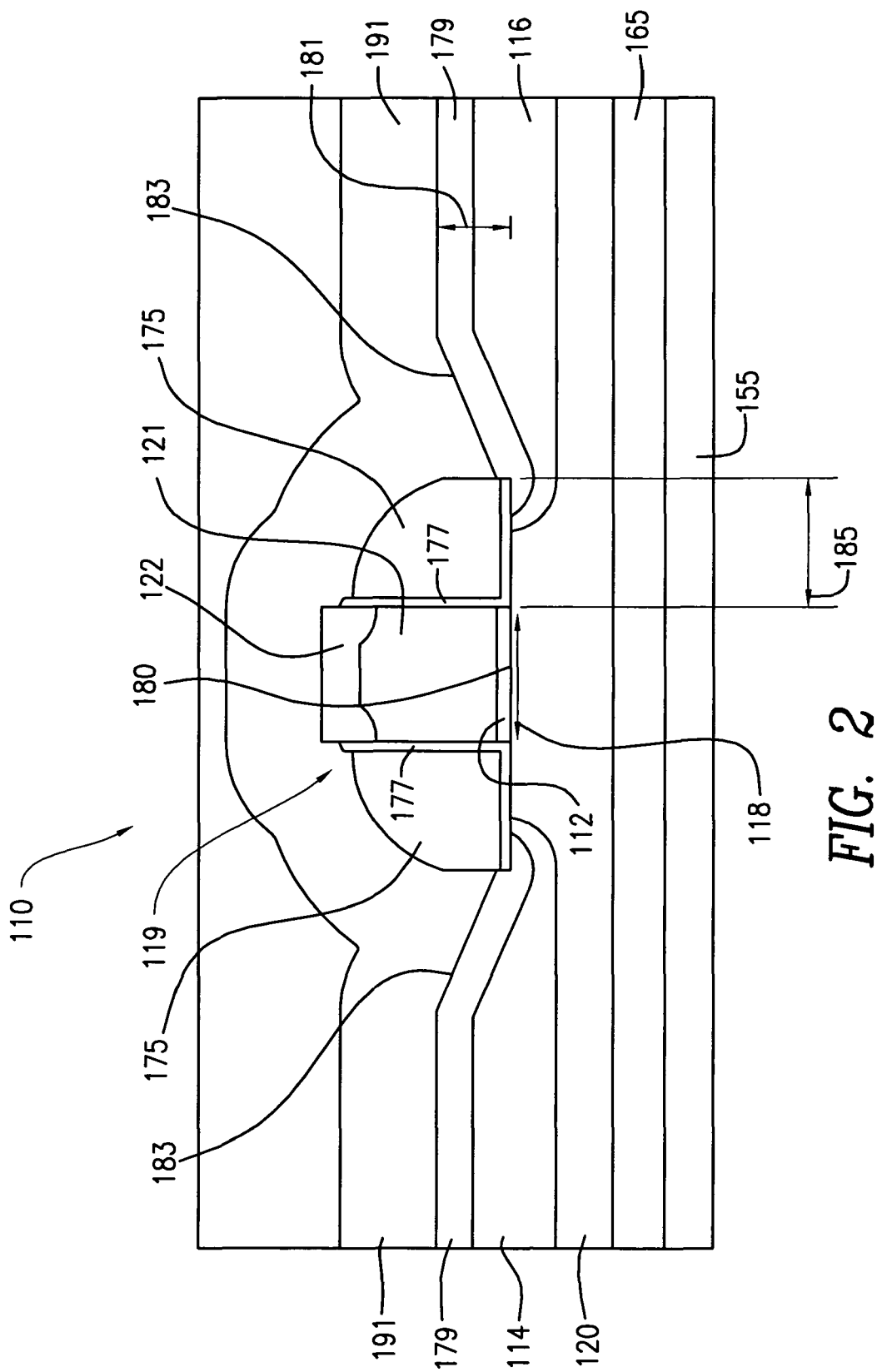
FIG. 2 is a cross-sectional view of the PMOS field effect transistor shown in FIG. 1 having additional layers formed on the device.

Referring now to FIG. 2, which shows a view of additional details of the NMOS device 110 of FIG. 1 after formation of spacers, layers over the source/drain regions, for example, silicide layers, and formation of the etch stop. It will be appreciated that the PMOS device shown in FIG. 1 may contain similar spacers and layers that may be tailored in dimensions and/or composition to affect the stress induced in the channel of the NMOS device as will be described further below. However, for illustration purposes, only NMOS device is shown and described in detail.

FIG. 2 shows spacers 175 that may be formed from suitable dielectric material incorporated around the gate 119. Offset spacers 177 may also be provided, which surround each of the spacers 175. Processes for forming shapes, sizes, and thickness of spacers 175 and 177 are known in the art and are not further described herein. The spacers 175 may be formed to a thickness, for example, between about 50 Angstroms and about 700 Angstroms necessary to electrically isolate the gate 119 from subsequently deposited material. The spacer 175 may comprise suitable insulating materials, for example, silicon nitride, silicon oxide, silicon oxynitride, or silicon carbide, deposited from any conventionally known process, such as chemical vapor deposition, and etched to form the shape as shown in FIG. 2.

Figure 3:
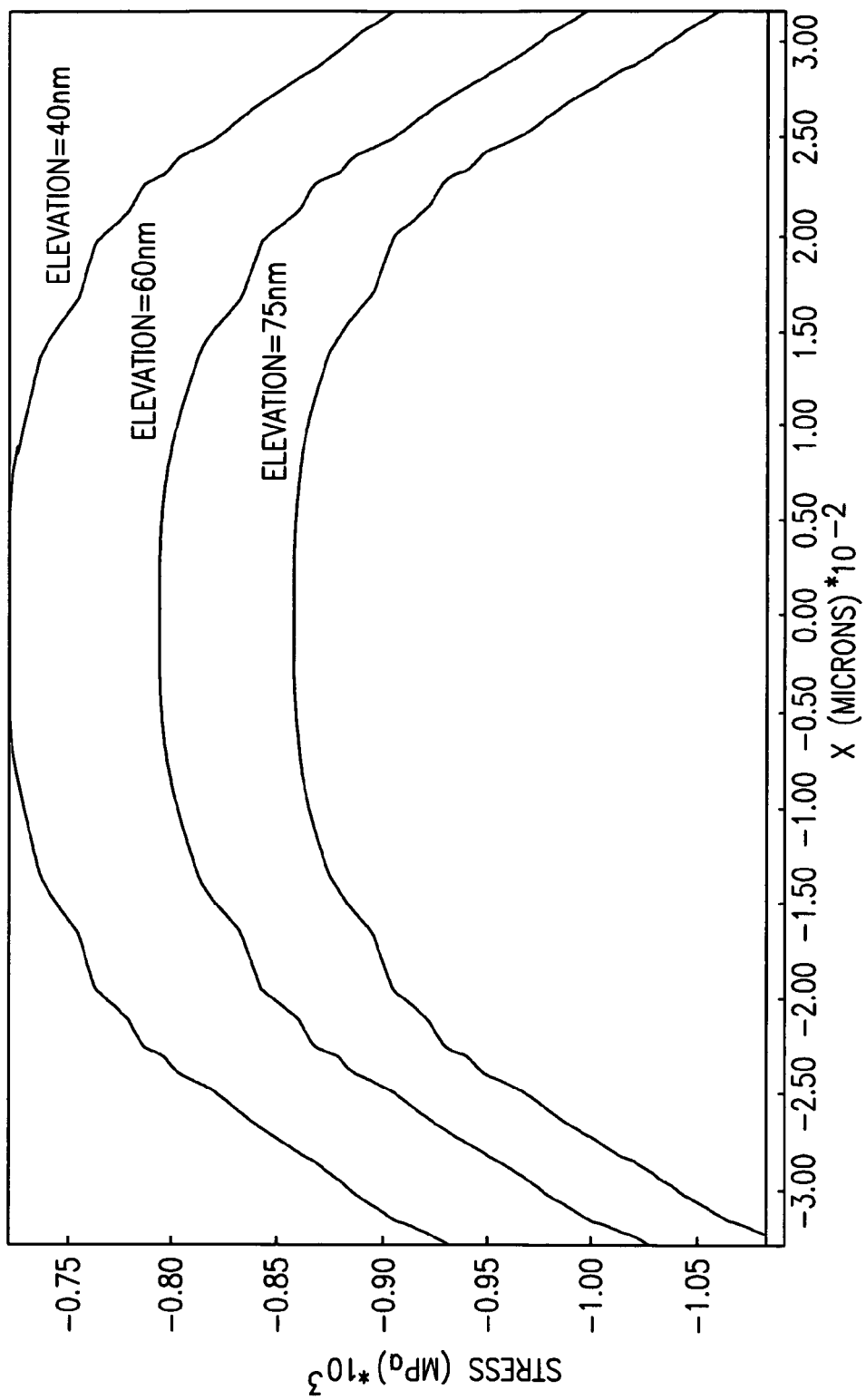
FIG. 3 is a graph showing the effect of source/drain elevation on the stress imparted to the channel region of a transistor.

A metal silicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The silicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface Referring now to FIG. 3, which is a graph showing the effect of elevation of the source/drain on strain imparted on the channel region 118, while the facet parameters are kept constant. As shown in FIG. 3, increasing the elevation 181 of a source/drain such as source drain region 116 from 40 nm to 60 nm to 75 nm increases the compressive stress on the channel region 118 of PMOS device 110.

Figure 4A:
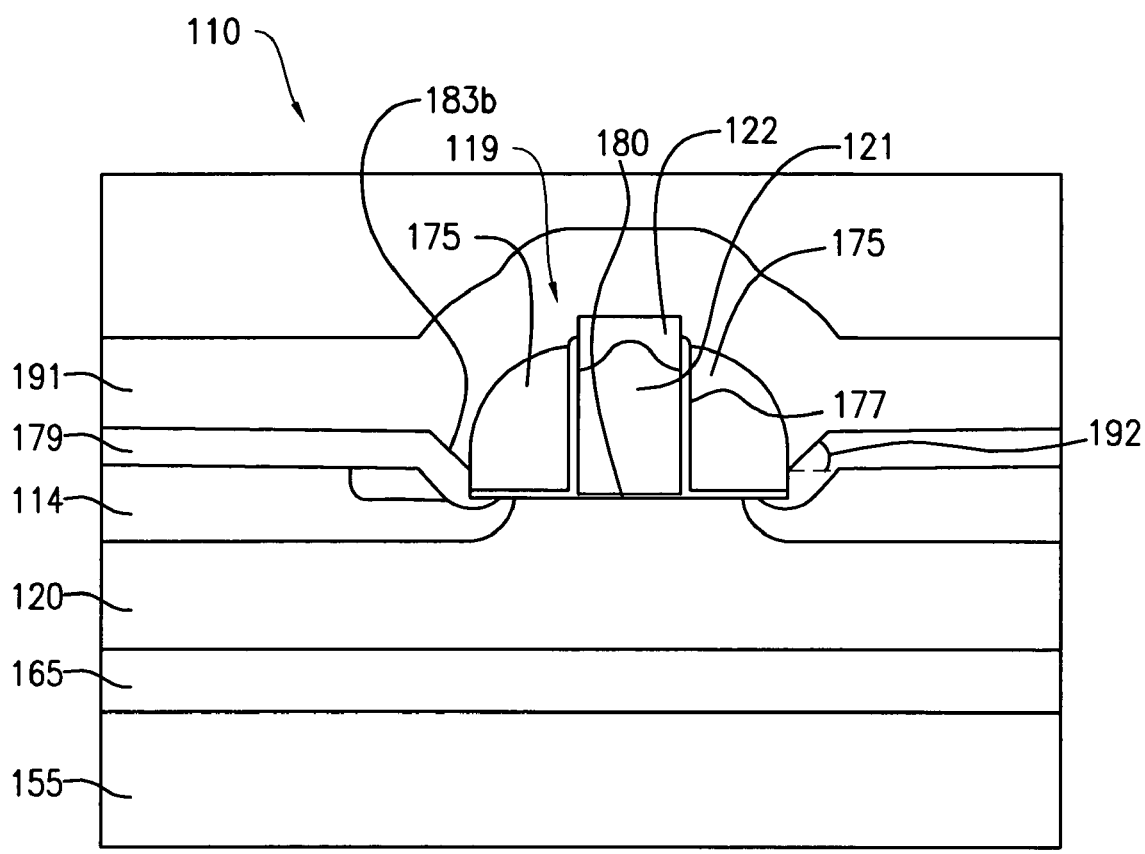
FIGS. 4A-4C illustrate a PMOS cross-sectional view of PMOS field effect transistors having decreasing facet length.
Figure 4B:
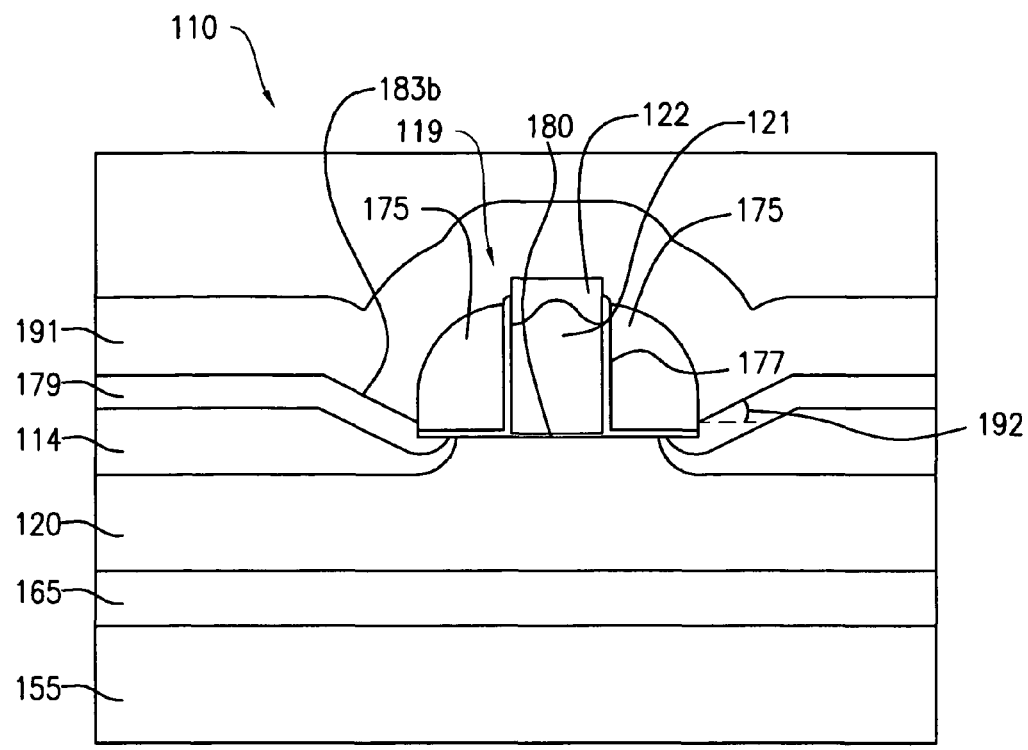
Figure 4C:
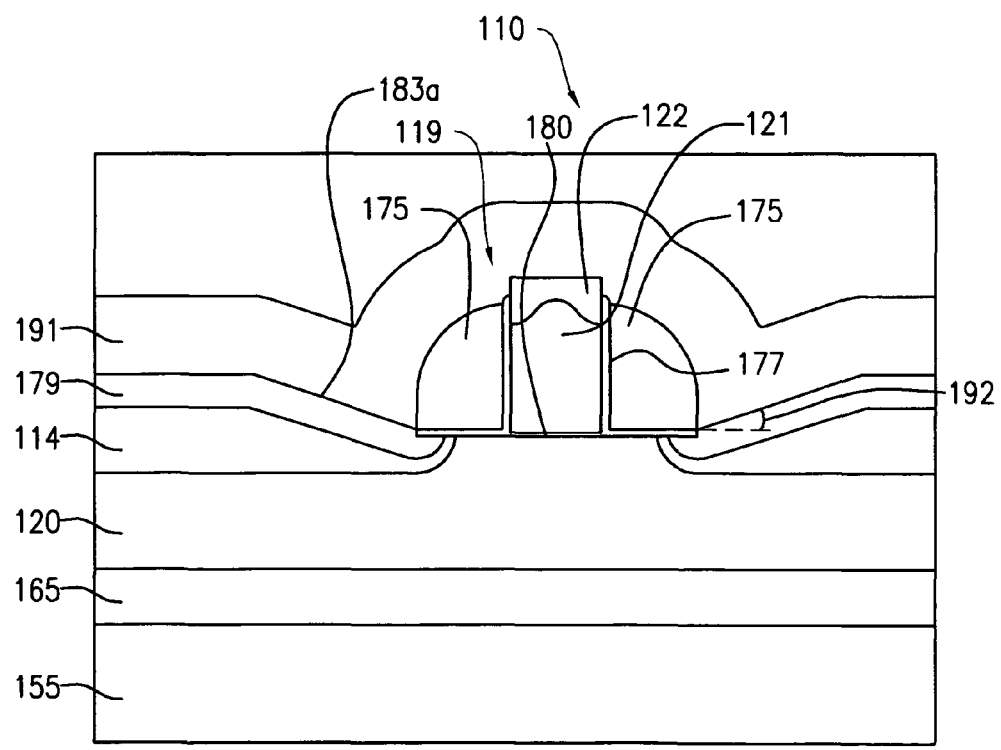
Figure 4D:
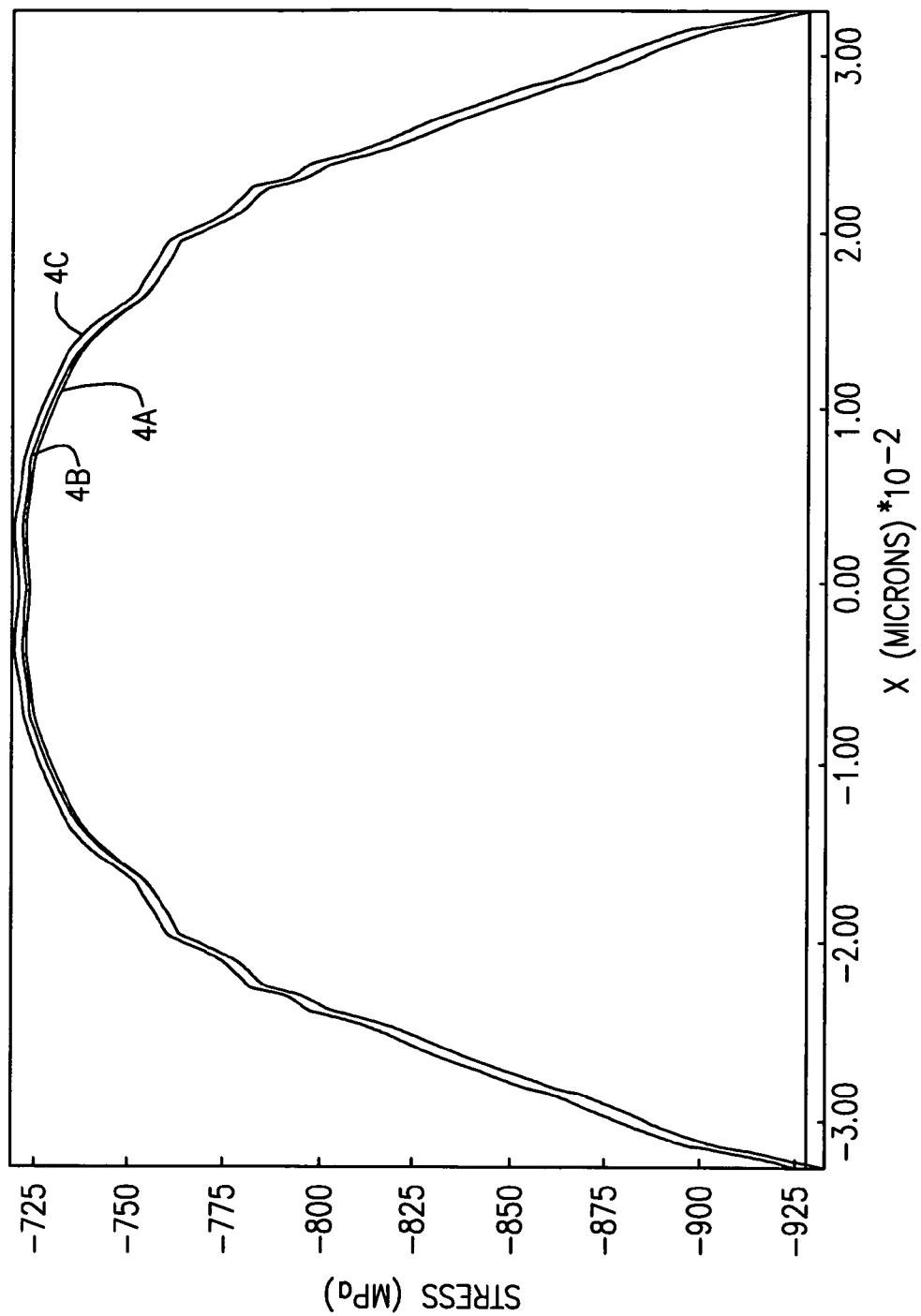
FIG. 4D is a graph showing the effect of facet length on stress imparted to the channel region of a transistor for the transistors shown in FIGS. 4A-4C, the transistors all having the same source/drain elevation and including SiGe source and drain regions and a compressive etch stop layer.

FIGS. 4A-C shows the change in facet of source and drain regions 114 and 116, while the elevation is kept constant in a device having SiGe in the source and drain regions 114 and 116 and a compressive etch stop layer 191. FIG. 4A shows a steep or short facet 183a, while FIG. 4B shows a less steep or longer facet 183b, and FIG. 4C shows a still less steep or still longer facet 183. The effect of facet steepness or length is shown in the graph of FIG. 4D, which shows the stress curve for each of the facets 183a, 183b, 183c depicted in FIGS. 4A, 4B, and 4C respectively. As shown in FIG. 4D, changing the steepness or length of the facet 183 has a minimal impact on the stress induced in channel region 118. As will be understood by the description of FIGS. 4E and 4F, the strain provided by the compressive etch stop layer 191 and the strain provided by the composition of the SiGe source and drain 114 and 116 effectively cancel each other out, and the effect of changing the facet length or angle does not have an effect on the channel stress.

Figure 4E:
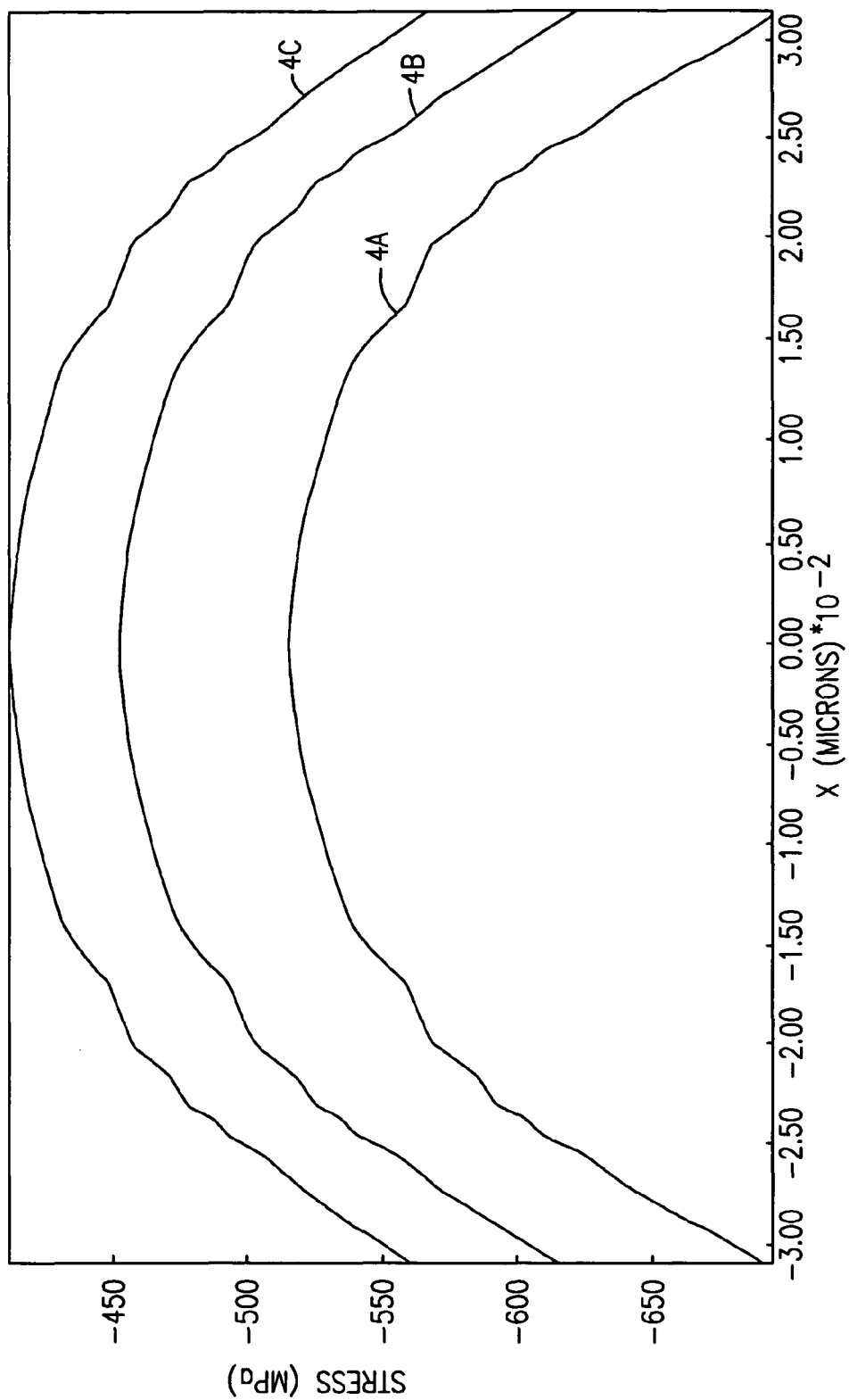
FIG. 4E is a graph showing the effect of changing facet length or angle on stress imparted to the channel region for the transistors shown in FIGS. 4A-4C for transistors having SiGe source and drain regions and no compressive etch stop layer.

Referring now to FIG. 4E, a graph showing the effect of facet length 193 or angle on channel stress when the source 114 and drain 116 have SiGe therein and the device does not include a compressive etch stop layer 191, for each of the facets 183a, 183b, 183c depicted in FIGS. 4A, 4B, and 4C respectively. As seen in FIG. 4E, without the effect of a compressive etch stop layer 191 to cancel out the effect of the compositional effect of SiGe in the source 114 and drain 116, decreasing the facet length (or increasing the facet angle 192) increases the compressive stress on the channel.

Figure 4F:
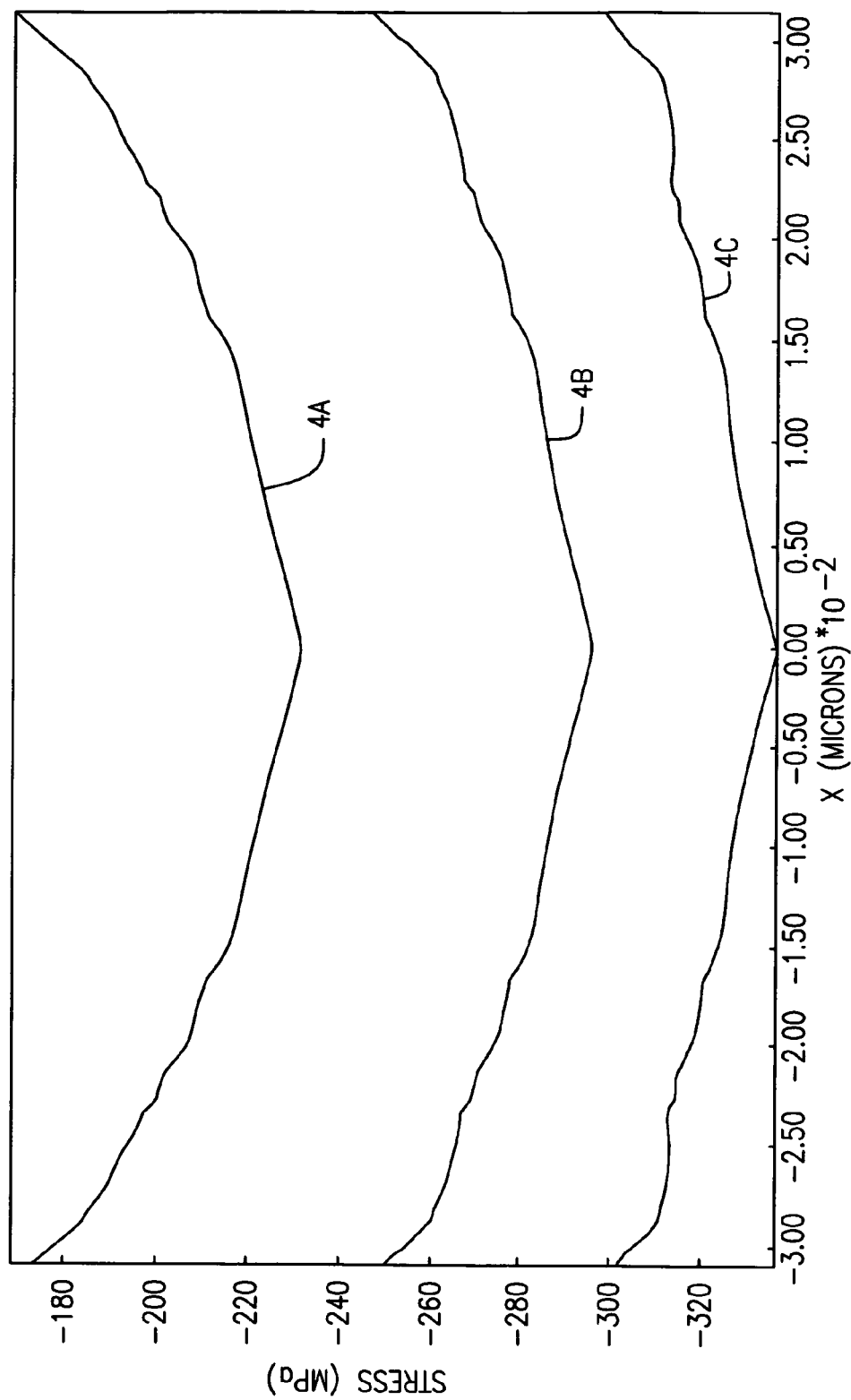
FIG. 4F is a graph showing the effect of changing facet length or angle on stress imparted to the channel region for the transistors shown in FIGS. 4A-4C for transistors having silicon source and drain regions and a compressive etch stop layer.

Referring now to FIG. 4F, a graph showing the effect of changing the facet length 193 or angle 192 on the combined stress from the facet length or angle and the compressive stress of the etch stop layer 191, for each of the facets 183a, 183b, 183c depicted in FIGS. 4A, 4B, and 4C respectively. As can be seen in FIG. 4F, increasing the facet length 193 (or decreasing the facet angle 192) increases the overall compressive stress in the channel.

Figure 5:
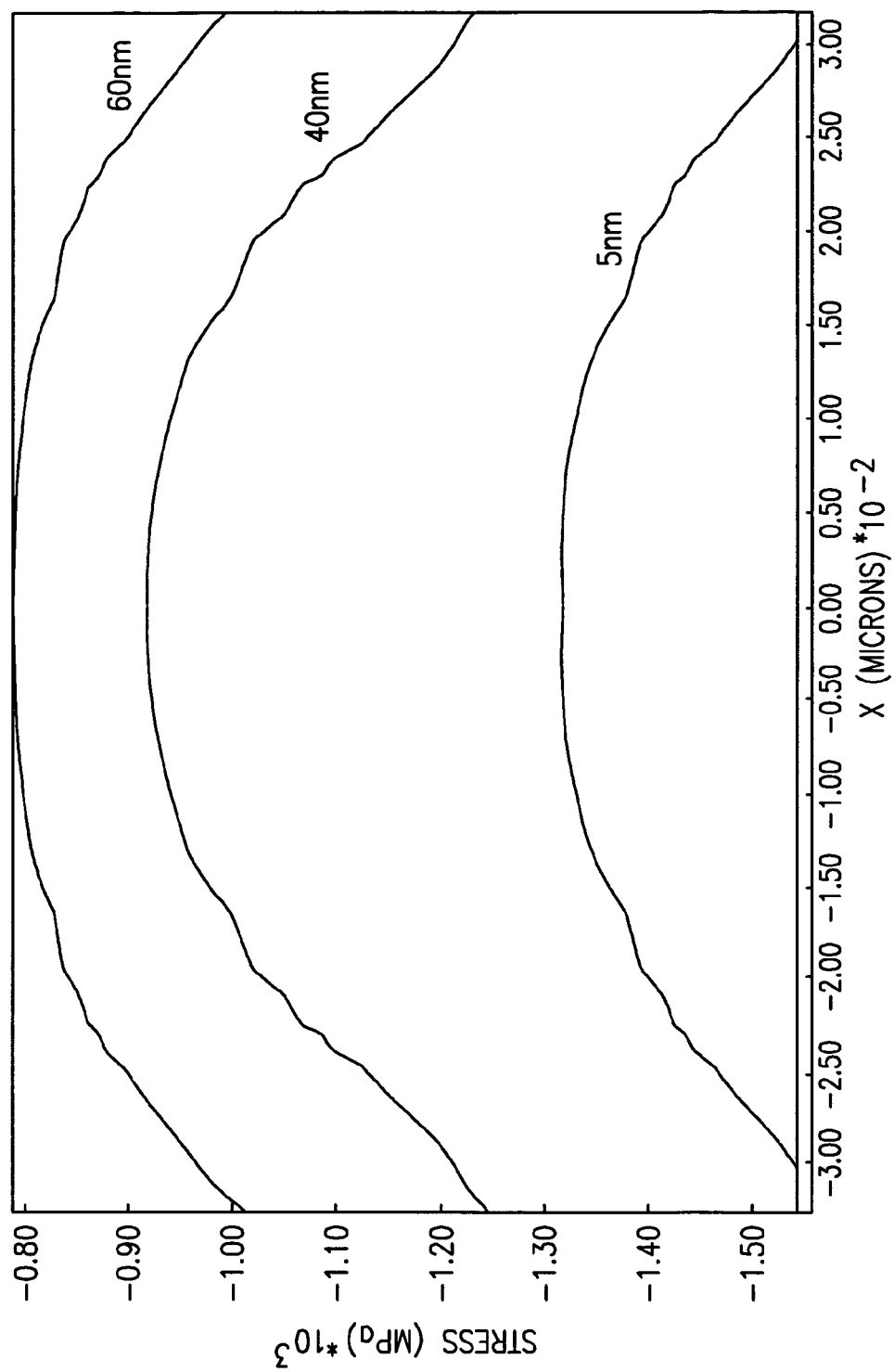
FIG. 5 is a graph showing the effect of changing the spacer width from 5 nm to 40 nm to 60 nm on the strain imparted to the channel region of a field effect transistor.

In FIG. 2, arrow 185 indicates spacer width. FIG. 5 is a graph showing the effect of decreasing spacer width 185 on channel 118 stress. As shown in FIG. 5, decreasing the width 185 of spacer 177 increases the compressive stress on the channel 118.

Figure 6:
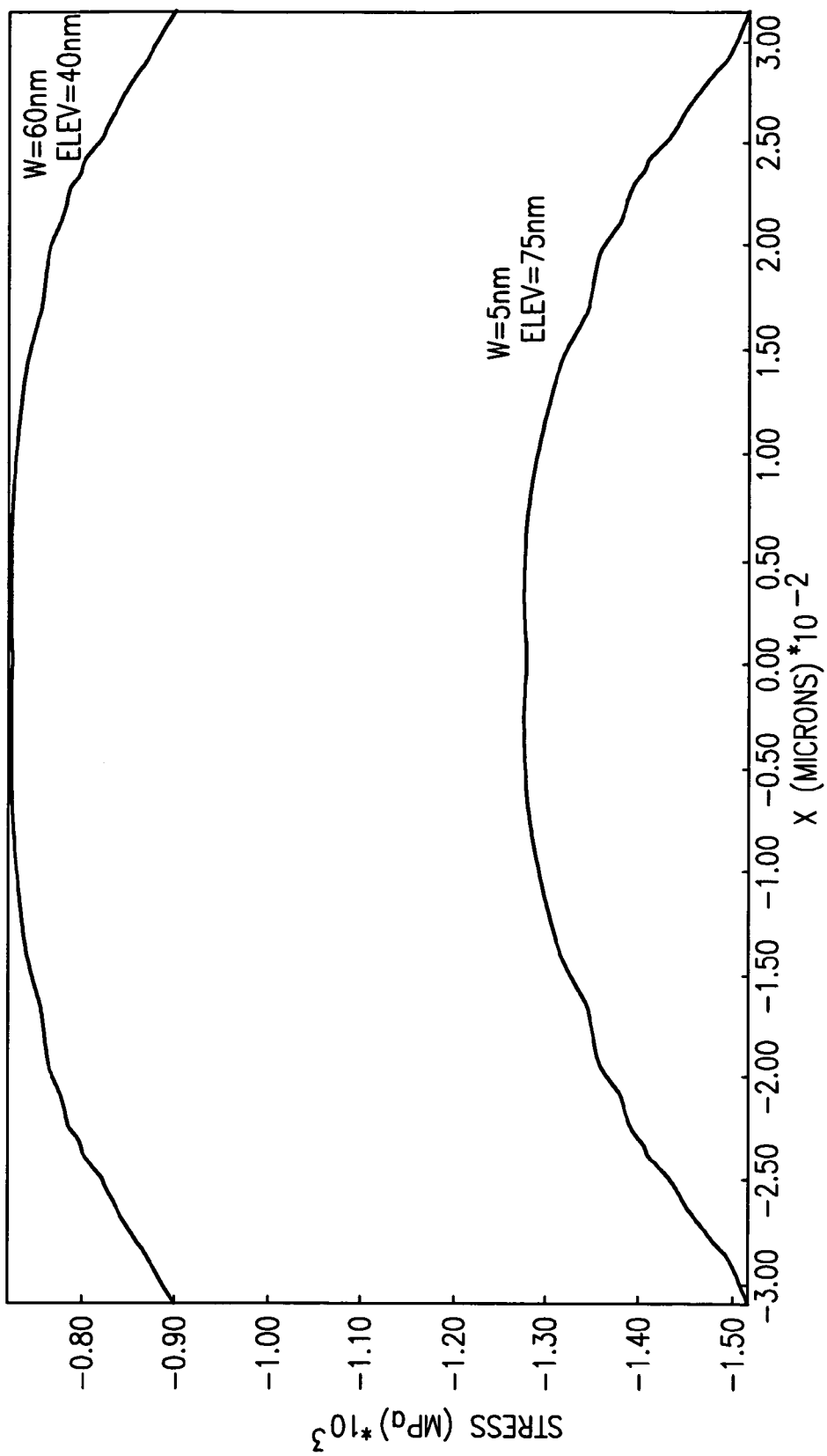
FIG. 6 is a graph showing the combined effect of changing the source drain elevation from 40 nm to 75 nm and changing the spacer width from 60 nm to 5 nm on channel strain in a field effect transistor.

FIG. 6 is a graph showing the combined effect of decreasing the spacer width 185 and increasing the elevation 181 of source/drain region on the compressive stress imparted on channel 118. As shown in FIG. 6, increasing the elevation and decreasing spacer width greatly increases the compressive stress imparted on the channel 118.

Thus, introducing multiple stressors or sources of stress to modulate or change the stress in the channel region of a single transistor can greatly alter the overall stress in the channel region. With proper experimental design and stress modeling, the channel stress of PMOS and NMOS transistors can be optimized by varying two or more parameters or stressors.

For example, channel stress can be optimized by modulating the source/drain silicon and germanium concentration, source/drain dimensions, source/drain facet length, source/drain dopant concentration, etch stop composition, etch stop dimensions, number of etch stop layers, etch stop spacer dimensions, source/drain facet angle and combinations of each of these parameters or sources of stress. The compressive effect of the etch stop layer can be changed by changing the thickness or the composition of the etch stop layer. The etch stop layer dimension can be altered by forming a etch stop layer with smaller dimensions. Alternatively, rather than depositing a single etch stop layer in one step, the same thickness layer can be formed by forming multiple single layers of the same material and cooling the substrate in between each layering operation. Simulation data has shown that modulating the different parameters involved in the multiple sources of stress can result in an increase in carrier mobility of up to 40% or higher, depending on the existing stress level in the device.

According to certain embodiments, the multiple stressor methodology and the variations in the different parameters described for the PMOS can be implemented for NMOS devices without affecting PMOS devices in the same integrated circuit. Ways of changing the stress in NMOS devices includes depositing SiC in the source/drain regions of a transistor after a recess etch of the source/drain region and then depositing a tensile-stressed nitride layer etch-stop layer as an additional stressor to produce higher stress than from either source of stress when used independently.

In one or more embodiments, the multiple uniaxial stressor methodology can be used in combination with increasing global strain using techniques known in the art. For example, a relaxed silicon layer on a silicon germanium buffer layer combined with a tensile nitride layer can be used to enhance electron mobility in an NMOS device and to some extent increase the hole mobility in the PMOS device (at low vertical electric field and high stress). In the NMOS devices, the silicon carbon in the recessed source/drain and the tensile etch stop layer could be used together or individually with the tensile strained silicon on silicon germanium buffer layer to even further increase the longitudinal and transverse tensile strain in the channel, both of which benefit electron mobility. In PMOS, the silicon germanium in the recessed source/drain and the compressive etch stop layer could be used together or individually with the tensile strained silicon on silicon-germanium buffer layer to increase the longitudinal compressive stress while maintaining the transverse tensile strain both of which benefit hole mobility.

Thus, various embodiments of the invention include changing the stress in a channel of a single transistor such as a PMOS or an NMOS field effect transistor by introducing multiple uniaxial stress sources to increase the channel stress. In other embodiments, multiple uniaxial stressors may be combined with global biaxial stress sources to modulate overall stress in a channel. It will be understood that while embodiments of the invention may have been described with respect to NMOS and PMOS devices alone, the channel stress of multiple individual devices in an integrated circuit may be adjusted by changing or modulating the different parameters described above that are associated with the multiple sources of stress.

While the foregoing is directed to embodiments of the present invention, other and further embodiments of the invention may be devised without departing from the basic scope thereof, and the scope thereof is determined by the claims that follow.

What is claimed is:

1. A method of forming a transistor on a substrate having a desired channel stress, comprising:
    a) providing a transistor having a channel region having a preexisting channel stress;
    b) determining the effect on the preexisting channel stress of changing the preexisting values of at least three parameters that together affect uniaxial local strain on selected regions of the transistor, the parameters affecting uniaxial local strain selected from the group consisting of source/drain elevation, source/drain silicon and germanium concentration, source/drain dimensions, source/drain facet length, source/drain facet angle, source/drain dopant concentration, etch stop composition or dimensions, number of etch stop layers, and spacer dimensions;
    c) selecting the changes in the preexisting values of said at least three parameters for design of a transistor having a channel region having the desired channel stress; and
    d) manufacturing a transistor having the selected changes, thereby providing a transistor having a channel region having the desired channel stress, wherein manufacturing the transistor further comprises forming at least first and second etch stop layers and cooling the substrate between formation of the first and second etch stop layers.

2. The method of claim 1, further comprising determining the further effect of changing the preexisting biaxial global strain on the transistor substrate, and selecting the further change in the preexisting biaxial global strain for design of a transistor having a channel region having the desired channel stress.

3. The method of claim 1, comprising selecting the changes in the preexisting values of the width of the spacer.

4. The method of claim 1, wherein the manufactured transistor has source/drain regions consisting essentially of silicon and dopants but essentially no Ge.

5. The method of claim 1, wherein the transistor is a PMOS transistor having a channel length less than 100 microns.

6. The method of claim 1, wherein the transistor is an NMOS transistor having a channel length less than 100 microns.

* * * * *